United States Patent [19]
Grabbe et al.

[11] Patent Number: 5,158,467
[45] Date of Patent: Oct. 27, 1992

[54] HIGH SPEED BARE CHIP TEST SOCKET

[75] Inventors: Dimitry G. Grabbe, Middletown; Iosif Korsunsky, Harrisburg; Daniel R. Ringler, Elizabethville, all of Pa.

[73] Assignee: AMP Incorporated, Harrisburg

[21] Appl. No.: 786,642

[22] Filed: Nov. 1, 1991

[51] Int. Cl.⁵ .............................. H01R 13/00
[52] U.S. Cl. ...................................... 439/71
[58] Field of Search .................. 439/68–73, 439/77

[56] References Cited

U.S. PATENT DOCUMENTS

| | | | |
|---|---|---|---|
| 3,885,173 | 5/1975 | Lee | 439/71 |
| 3,951,495 | 4/1976 | Donaher | 439/71 |
| 4,079,511 | 3/1978 | Grabbe | 29/627 |
| 4,089,575 | 5/1978 | Grabbe | 439/71 |
| 4,426,769 | 1/1984 | Grabbe | 29/588 |
| 4,513,353 | 4/1985 | Bakermans et al. | 361/399 |
| 4,560,826 | 12/1985 | Burns et al. | 174/52 FP |
| 4,684,184 | 8/1987 | Grabbe et al. | 439/64 |
| 4,699,593 | 10/1987 | Grabbe et al. | 439/71 |
| 4,744,009 | 5/1988 | Grabbe et al. | 361/398 |
| 4,832,612 | 5/1989 | Grabbe et al. | 439/71 |
| 4,873,615 | 10/1989 | Grabbe | 361/395 |
| 4,880,386 | 11/1989 | Grabbe et al. | 439/68 |

Primary Examiner—Joseph H. McGlynn
Attorney, Agent, or Firm—Allan B. Osborne; Bruce J. Wolstoncroft

[57] ABSTRACT

An electrical socket (10) for interconnecting circuits on an integrated circuit chip to circuits on a substrate is disclosed. The socket (10) includes a base section (12), an upper section (16) and a metallized plastic membrane (14) having circuit traces (72) thereon. Contact pins (52) in the upper section (16) electrically connect circuits on the chip to inner ends (82) of the traces (72) and outer ends (84) of the traces (72) engage circuits on a substrate.

11 Claims, 3 Drawing Sheets

HIGH SPEED BARE CHIP TEST SOCKET

FIELD OF THE INVENTION

The invention disclosed herein relates to electrical sockets which will permit the testing at high speed, as well as burn-in of the now emerging large and complicated integrated circuit chips prior to being packaged.

BACKGROUND OF THE INVENTION

As integrated circuit chips become larger and more complex, the circuits therein are being crowded closer together so that the next generation of chips will have bonding pads on 0.003 inch centers. According, it is now proposed to provide a test socket capable of testing at full speed as well as burning-in of these next generation bare or chips.

SUMMARY OF THE INVENTION

According to the present invention, an electrical socket for interconnecting circuits of an integrated circuit chip to circuits on a substrate is provided. The socket includes a base section, an upper section comprising a contact pin retaining portion, contact pins in the retaining portion with first and second ends protruding from opposite surfaces and a frame having an opening for receiving a chip with the circuits thereon engaging first ends of respective contact pins. The socket also includes a membrane comprising a dielectric base layer with circuit traces on one surface. An inner portion of the membrane is positioned between the base section and upper section with inner ends of the circuit traces engaging second ends of the contact pins and an outer portion of the membrane extending outwardly from the socket with outer ends of the circuit traces engaging circuits on a substrate.

DESCRIPTION OF THE INVENTION

Figure 1:
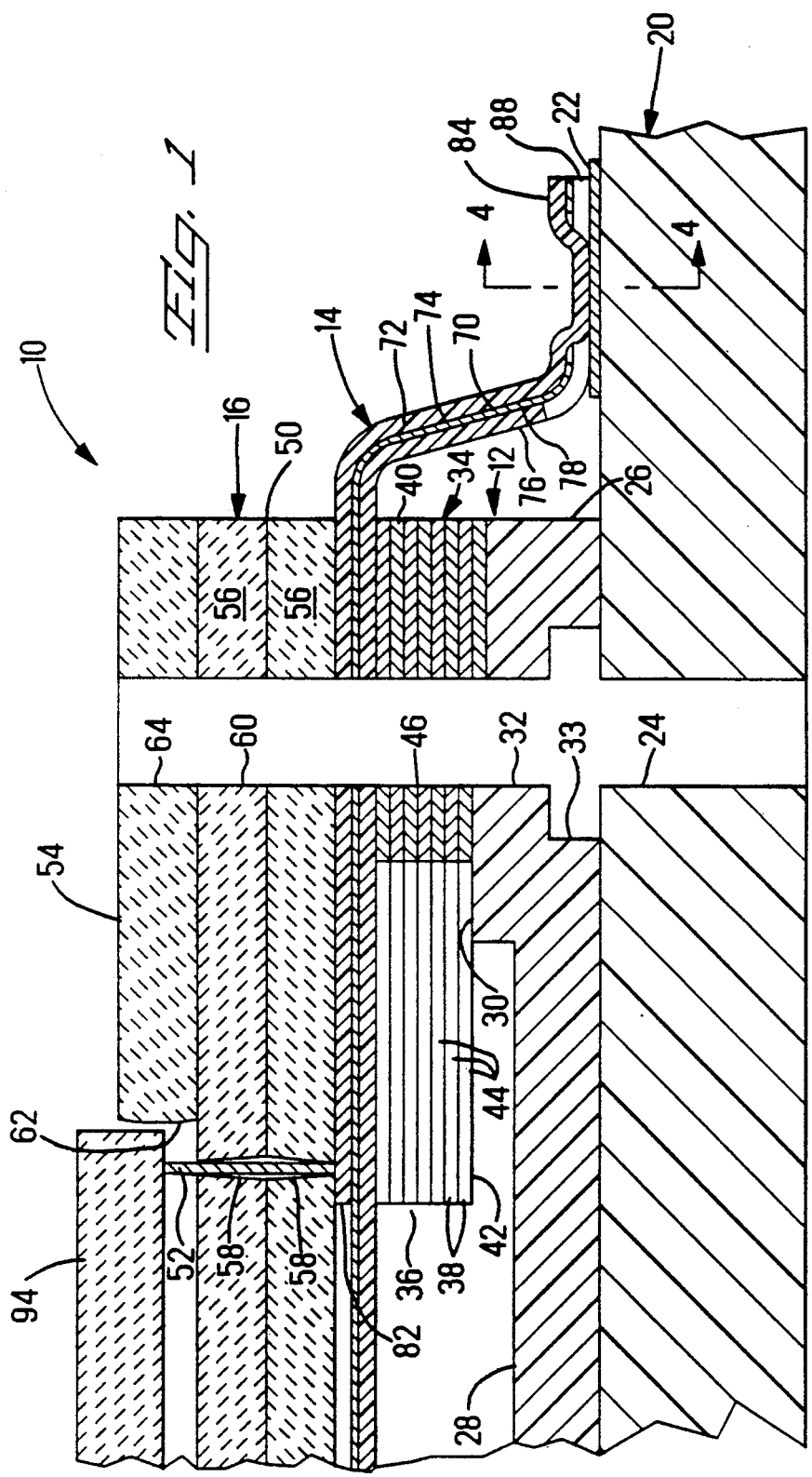
FIG. 1 is a sectioned view of a socket according to one embodiment of the invention.

As shown in FIG. 1, socket 10 of the present invention includes base section 12 metallized plastic membrane 14 and upper section 16. Socket 10 is shown positioned on substrate 20 with membrane 14 electrically engaging circuit pads 22 thereon. Substrate 20 further includes mounting holes 24.

Base section 12 comprises base plate 26 formed by molding a dielectric plastics material such as General Electric's VALOX 420 SEO or other suitable material. Clearance cavity 28 is provided in surface 30 of plate 26 and mounting holes 32 extend through plate 26 adjacent each corner. Each hole 32 includes shoulder 33.

Further included as part of base section 12 is stack 34 having a center opening 36 and formed from a plurality of thin spring steel sheets 38. The outer portion 40 is solid while inner portion 42 is slotted to provide inwardly projecting spring fingers 44 with each finger 44 adapted to underlie and resiliently support an individual circuit trace 72 (FIG. 3) on membrane 14. In addition, mounting holes 46 extend through stack 36 adjacent each corner. Whereas stack 34 is shown to consist of a number of sheets 38, at least one sheet 38 is required.

Metallized plastic membrane 14 will be described below with reference to FIG. 3.

Upper section 16 comprises contact pin retaining portion 50, contact pins 52 and frame 54. Retaining portion 50 is formed from one or more layers 56 of glass or ceramic. Holes 58 extend through portion 50 according to a pre-determined pattern and on a predetermined center-line spacing. Aspects to the pattern and spacing will be discussed below with reference to FIG. 2. Holes 58 may be slightly tapered such that in a two layer portion as illustrated, each hole 58 is circumferentially larger at a mid-point than at the respective ends. Mounting holes 60 are provided in portion 50 adjacent each corner.

Contact pins 52, which are disposed in holes 58, are formed from any suitable low resistance conductive material capable of being formed into extremely small sizes. In the preferred embodiment, contact pins 52 are made from Palliney 7 or ORO 28 A at J. M. Ney Company of Hartford, Conn.

Frame 54, preferably made from ceramic or other wear resistant material, is provided with a centrally located opening 62 and alignment holes 64 adjacent each corner.

Figure 2:
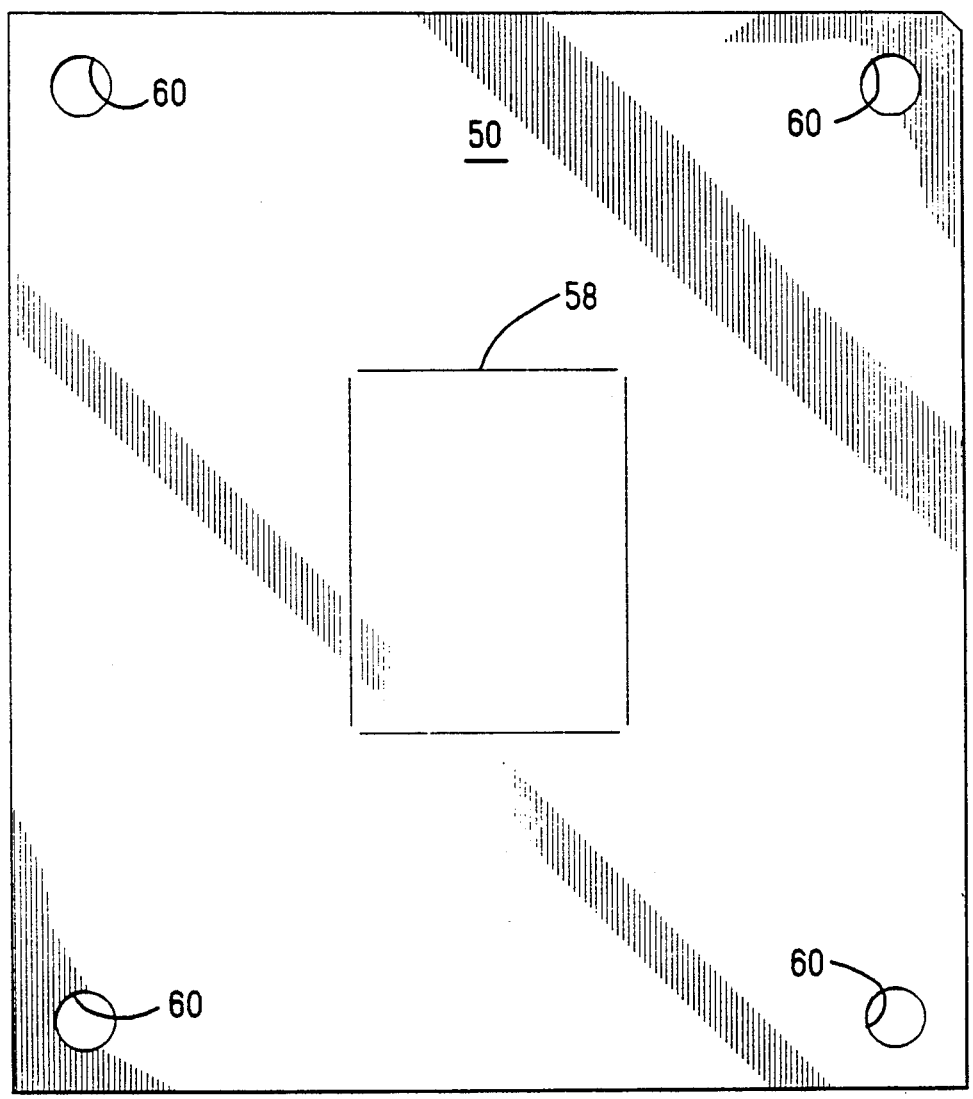
FIG. 2 is a top plan view of a contact pin retaining portion of the socket.

FIG. 2 shows a surface of retaining portion 50 drawn to the scale to socketed a particular microprocessor. Holes 58, arranged in a given pattern, are on a center line spacing of about 0.0051 to 0.001 inches and have a diameter of 0.0025 inches. There are a total of 480 holes 58 in this particular illustrated embodiment.

Contact pins 52 for use in holes 58 have a diameter of 0.002 inches or 0.001 inches as the case may be.

Figure 3:
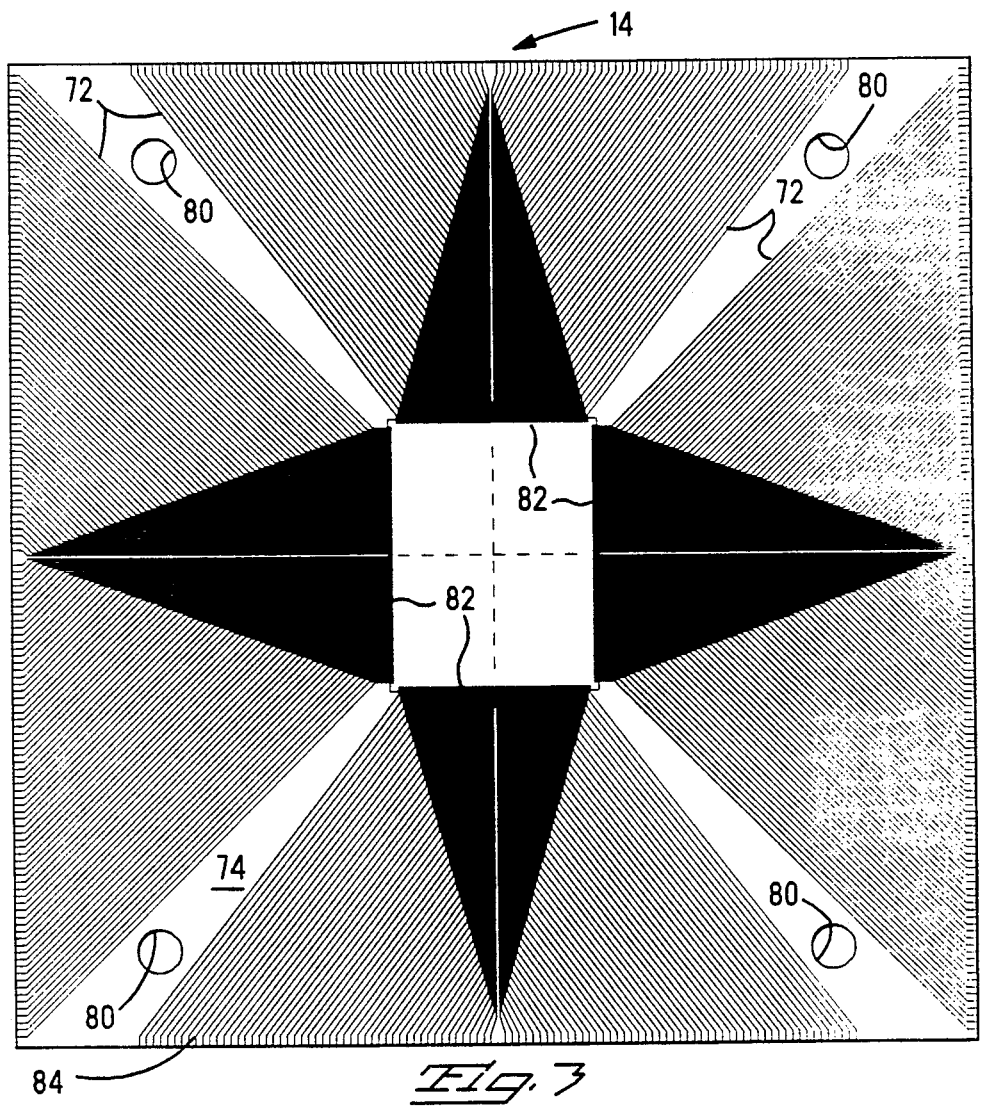
FIG. 3 is a top plan view of a metallized plastic membrane of the socket.

With reference to FIGS. 1 and 3, metallized plastic membrane 14 is a composite comprising a base layer 70 of a plastics material such as the DuPont Company's "KAPTON", circuit traces 72 on surface 74 and a ground plane 76 on opposite surface 78. Mounting holes 80 are provided near each corner.

Inner ends 82 of traces 72 define a rectangular pattern identical to the pattern of holes 58 in retaining portion 50 as shown in FIG. 2. In this high density zone, the width of each inner end 82 is from about 0.002 to 0.001 inches. Traces 72 fan outwardly to outer ends 84 along the edges of membrane 14.

Traces 72, which have an average thickness of about 0.0013 inches, are preferably copper which can be laminated, sputtered or additively deposited of surface 74 of base layer 70. Other methods of providing traces 72 can also be used. Further traces 72 may be selectively plated with gold or other noble metals.

Figure 4:
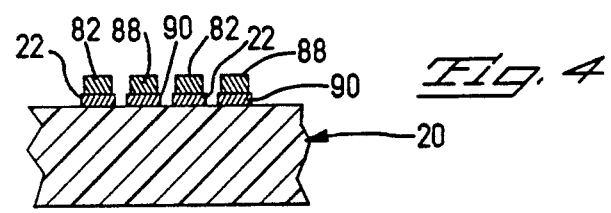
FIG. 4 is a sectioned view taken along lines 4—4 of FIG. 1.

Ground plane 76 may be a solid sheet of copper covering surface 78. Alternatively plane 76 may be constructed as a mirror image of traces 72 with the outer ends 88 being off-set laterally with respect to outer ends 84 of traces 72. Thus, as shown in FIG. 4, outer ends 84 and 88 are interdigitated at the soldering locations on substrate 20.

Socket 10 is assembled as shown in FIG. 1 with the several components stacked on top of each other and secured together by any suitable means. As is readily apparent to those skilled in the art, inner ends 82 of traces 72 are in registration with spring fingers 44 which project out over cavity 28 in base plate 26 and also in alignment with respective contact pins 52. Although not shown, holes 58, in addition to housing pins 52, are preferably loaded with a suitable viscous compound, such as for example but not limited to dimethelsiloxyne. The compound will prevent pins 52 from falling out but will not prevent sliding motion under force. Further, it will provide a seal against contaminants and will protect the interface between pins 52 and inner ends 82 of traces 72.

Outer ends 84 of traces 72 are soldered to circuit pads 22 on substrate 20 or otherwise electrically attached thereto. Similarly ground plane 76, either as a solid sheet or as traces, are electrically attached to ground pads 90 (FIG. 4) on substrate 20.

Socket 10 may be held together and secured to substrate 20 with the use of conventional fastening means in conjunction with mounting holes 32, 46, 60, 64 and 80. In this regard, socket 10 can be pre-assembled using bolts with threaded shafts at opposite ends and a upset therebetween (not shown). The upset engages shoulder 33 in hole 32 and one threaded shaft extends through socket 10 to receive a nut (not shown) to secure the socket together. Subsequently, socket 10 can be mounted onto substrate 20 by passing the opposite shafts through substrate holes 24 to receive a nut (not shown) and secure socket 10 thereto.

As shown in FIG. 1, an integrated circuit chip 94 is placed in opening 62 with the bonding pads (not expressly shown) engaging contact pins 52 for testing and burn-in as required.

Not shown are covers or other means for exerting a force on chip 94 as such are well known in the art.

FIG. 4 is a sectioned view showing interdigitated outer traces 82 and 88 soldered to pads 22 and 90 respectively on substrate 20.

Socket 10 has been developed for use in testing bare chips. It should be obvious however that socket 10 can be used to test leadless chip carriers and can also be used in general, non-testing environments.

As can be discerned from the foregoing discussion in reference with the drawings, a test socket for testing bare integrated circuit chips has been described. The socket includes a base section having spring fingers for supplying a resilient force against the engaging contact surfaces of circuit traces on a metallized plastic membrane and lower ends of contact pins located in an upper portion of the socket. The outer ends of the contact pins engage bonding pads on the chip. The circuit traces on the membrane are electrically connected to circuit pads on a substrate so that the chip can be tested and burnt-in as required.

We claim:

1. An electrical socket for interconnecting integrated circuit chip circuits to circuits on a substrate, comprising:
   a base section;
   an upper section having a contact pin retaining portion, conductive contact pins in said retaining portion with first and second ends protruding from opposite surfaces and a frame overlying said retaining portion and having an opening therethrough for receiving an integrated circuit chip with circuits on said chip engaging first ends of respective said contact pins; and
   a membrane comprising a dielectric base layer with conductive circuit traces on one surface thereof, said membrane having an inner portion positioned between said base section and said upper section with inner ends of said circuit traces engaging second ends of said contact pins and an outer portion extending outwardly from said socket with outer ends of said circuit traces engaging circuits on a substrate.

2. The socket of claim 1 further including spring means underlying said inner ends of said circuit traces for resiliently opposing forces being applied to said inner ends.

3. The socket of claim 2 wherein said spring means include spring fingers with each finger underlying a respective said circuit trace.

4. The socket of claim 1 wherein said retaining portion includes holes therethrough for receiving said contact pins and for receiving a viscous compound.

5. The socket of claim 4 wherein said retaining portion is formed of two glass layers.

6. The socket of claim 1 wherein said contact pins are formed from Palliney 7.

7. The socket of claim 1 wherein said contact pins are formed from ORO 28 A.

8. The socket of claim 1 further including ground plane means on an opposite surface of said membrane base layer.

9. The socket of claim 8 wherein said ground plane means include a metallic sheet.

10. The socket of claim 1 wherein said ground plane means include traces essentially being a mirror image of said circuit traces.

11. The socket of claim 9 wherein outer ends of said ground plane traces are laterally off-set relative to respective said circuit trace outer ends.

* * * * *